US009432053B1

(12) United States Patent
Graumann et al.

(10) Patent No.: US 9,432,053 B1
(45) Date of Patent: Aug. 30, 2016

(54) HIGH SPEED LDPC DECODER

(71) Applicant: MICROSEMI STORAGE SOLUTIONS (U.S.), INC., Aliso Viejo, CA (US)

(72) Inventors: Peter Graumann, Calgary (CA); Sean Gibb, Calgary (CA); Jonathan Eskritt, Airdrie (CA)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 242 days.

(21) Appl. No.: 14/325,172

(22) Filed: Jul. 7, 2014

(51) Int. Cl.
*H03M 13/11* (2006.01)
(52) U.S. Cl.
CPC ..... *H03M 13/1108* (2013.01); *H03M 13/1111* (2013.01)
(58) Field of Classification Search
CPC .......................... G06F 11/1012; G06F 11/1068
USPC .......................................................... 714/764
See application file for complete search history.

(56) References Cited

U.S. PATENT DOCUMENTS

| | | | |
|---|---|---|---|
| 5,721,745 A * | 2/1998 | Hladik .............. | H03M 13/2957 714/755 |
| 8,108,762 B2 | 1/2012 | Liu et al. | |
| 8,359,522 B2 | 1/2013 | Gunnam et al. | |
| 9,092,353 B1 * | 7/2015 | Micheloni .......... | G06F 11/1008 |
| 2009/0070659 A1 * | 3/2009 | Zhong .............. | H03M 13/1122 714/801 |
| 2015/0149873 A1 * | 5/2015 | Cai .................... | H03M 13/458 714/773 |

FOREIGN PATENT DOCUMENTS

EP 2051385 4/2009

OTHER PUBLICATIONS

Weiner, Matthew et al., "A High-Throughput, Flexible LDPC Decoder for Multi-Gb/s Wireless Personal Area Networks", Technical Report No. UCB/EECS-2010-177, Dec. 22, 2010, 73 pages, Electrical Engineering and Computer Sciences University of California at Berkeley, CA.

* cited by examiner

*Primary Examiner* — David Ton
(74) *Attorney, Agent, or Firm* — Dennis R. Haszko

(57) ABSTRACT

A method and decoder are provided to decode a Low Density Parity Check codeword. An additional check processor performs hard-decision processing functions on the LDPC codeword in order to avoid running unnecessary decoder iterations. The method comprises: receiving the ECC codeword at a memory, the received ECC codeword comprising ECC data bits, ECC parity bits, and error detection code bits; soft-decision decoding the received ECC codeword at a soft-decision decoder, to update the ECC codeword according to ECC parity check equations; hard-decision processing the received ECC codeword at a check processor, while the soft-decision decoder performs the soft-decision decoding, to verify the ECC data bits using the error detection code bits; terminating the soft-decision decoding when the ECC data bits are verified, regardless of whether the updated ECC codeword satisfies all of the ECC parity check equations; and, outputting the decoded ECC codeword from the memory after termination of the decoding.

26 Claims, 9 Drawing Sheets

|  | $C_{D1}$ | $C_{D2}$ | $C_{D3}$ | $C_{D4}$ | $C_{D5}$ | $C_{P1}$ | $C_{P2}$ | $C_{P3}$ | $C_{P4}$ | $C_{P5}$ | $C_{P6}$ |
|---|---|---|---|---|---|---|---|---|---|---|---|
| $R_1$ | 7 | -1 | -1 | -1 | -1 | 11 | -1 | -1 | -1 | -1 | 1 |
| $R_2$ | -1 | 3 | -1 | -1 | -1 | -1 | 2 | -1 | -1 | 2 | -1 |
| $R_3$ | -1 | -1 | -1 | 0 | -1 | -1 | -1 | 15 | -1 | -1 | -1 |
| $R_4$ | -1 | -1 | 12 | -1 | 4 | -1 | -1 | -1 | 14 | -1 | -1 |
| $R_5$ | 10 | -1 | 2 | -1 | 5 | -1 | -1 | 11 | -1 | -1 | 0 |
| $R_6$ | -1 | 3 | -1 | 4 | -1 | 9 | 6 | -1 | 8 | 4 | -1 |

FIG. 2

HIGH SPEED LDPC DECODER

FIELD

The present disclosure relates generally to the field of data communications and error coding.

BACKGROUND

Low Density Parity Code (LDPC) decoders are current generation iterative soft-input forward error correction (FEC) decoders that have found increasing popularity in FEC applications where low error floor and high performance are desired. LDPC decoders are defined in terms of a two-dimensional matrix, referred to as an H matrix, which describes the connections between the data and the parity. The H matrix comprises rows and columns of data and parity information. Decoding an LDPC code requires solving the LDPC code according to the H matrix based on a two-step iterative method. Soft-decision decoding the code causes convergence of the solved code with the true code; convergence is achieved over a number of iterations and results in a corrected code with no errors.

A category of LDPC codes, known as quasi-cyclic (QC) codes, generates an H matrix with features that improve the ease of implementing the LDPC encoder and decoder. In particular, it is possible to generate a QC-LDPC H matrix where some rows are orthogonal to each other. These orthogonal rows are treated as a layer, and rows within a layer can be processed in parallel, thus reducing the iterative cost of the decoder. It is advantageous to reduce the number of iterations necessary to decode an LDPC code.

The standard criteria for determining when to exit the soft-decision decoding iterations uses check node outputs to determine when the decoder has converged. This is an area efficient exit criteria, but requires nearly a full iteration of extra run time beyond the iteration in which the decoder has converged. This full iteration cost is especially steep at typical operating points for an LDPC code where it is desirable to have codes that are converging in as few iterations as possible. For instance, if an operating point is defined by code convergence in an average of 5 iterations, then an extra iteration to determine exit status costs on the order of 20% more time and power. Even when the average convergence is 10 iterations, the exit status determination will cost approximately 10% more time and power than necessary.

One known approach to allow the decoder to exit as soon as possible comprises adding a check processor to recheck all parity equations after every soft-decision decoding iteration. Full parity check exit determination is most suitable for small fixed code LDPC decoders. However, while such an approach overcomes the extra iteration of the standard method, the additional check processor comes at the cost of a large area footprint, even for a small fixed code LDPC code. Large FEC block LDPC codes are advantageous for various reasons relating to reduced overhead; however, full parity check exit determination of a large FEC block LDPC code is difficult to implement due to the necessity of routing massive XOR trees.

Known LDPC decoders are also adversely affected by codeword loading and unloading to and from the codeword memory of the LDPC decoder. When loading a codeword from a decoder input into the memory of the decoder, or when unloading a codeword from the memory to the output of the decoder, the decoder core is unable to access the memory and remains idle, reducing the overall decoding speed of the LDPC decoder.

Improvements to error decoding methods and decoders are desirable.

BRIEF DESCRIPTION OF DRAWINGS

FIG. 2 shows an exemplary known Quasi-Cyclic (QC) H matrix used for decoding QC LDPC codes.

DETAILED DESCRIPTION

Figure 1:
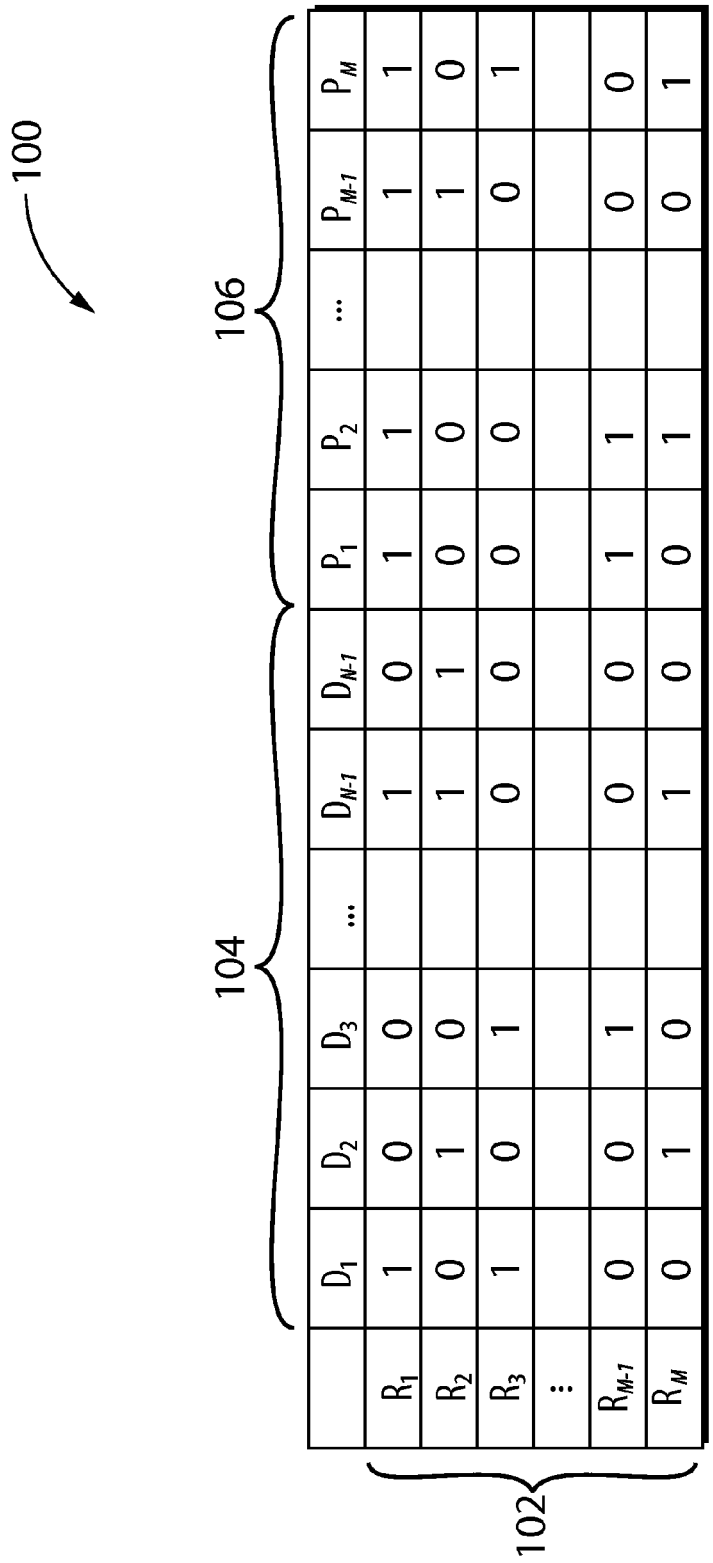
FIG. 1 shows an exemplary known LDPC H matrix.

A method and decoder are provided to decode a Low Density Parity Check codeword. The present disclosure provides an additional check processor to perform hard-decision processing functions on the LDPC codeword in order to avoid running unnecessary decoder iterations. In contrast to known approaches, the check processor allows for timely exiting of the power intensive decoding process while doing so in an area and power efficient manner and while supporting high throughput applications.

In an embodiment of the present disclosure, a method for decoding an error correcting code (ECC) codeword comprises: receiving the ECC codeword at a memory, the received ECC codeword comprising ECC data bits, ECC parity bits, and error detection code bits; soft-decision decoding the received ECC codeword at a soft-decision decoder, to update the ECC codeword according to ECC parity check equations; hard-decision processing the received ECC codeword at a check processor, while the soft-decision decoder performs the soft-decision decoding, to verify the ECC data bits using the error detection code bits; terminating the soft-decision decoding when the ECC data bits are verified, regardless of whether the updated ECC codeword satisfies all of the ECC parity check equations; and, outputting the decoded ECC codeword from the memory after termination of the decoding.

In a further embodiment of the present disclosure, the method comprises: determining a convergence status of the soft-decision decoding; and initiating the hard-decision processing when the convergence status of the soft-decision decoding exceeds a threshold.

In yet a further embodiment of the present disclosure, the method comprises: hard-decision processing the decoded ECC codeword stored in memory after terminating the decoding and before outputting the decoded ECC codeword in order to further verify the ECC data bits; and soft-decision decoding the decoded ECC codeword stored in memory if the further verification fails.

In yet a further embodiment of the present disclosure the ECC codeword is a low density parity check (LDPC) codeword comprising LDPC data bits, CRC bits, and LDPC parity bits.

In yet a further embodiment of the present disclosure, the method comprises: calculating a CRC check value from the LDPC data bits; extracting a CRC check value from the CRC bits; and comparing the calculated CRC check value to the extracted CRC check value.

In yet a further embodiment of the present disclosure, the method comprises calculating at least a portion of parity check equations of an LDPC code with the decoded codeword; and verifying whether the number of successfully calculated parity check equations exceeds a threshold.

In yet a further embodiment of the present disclosure, the method comprises updating variable node values of the LDPC codeword according to one check node constraint, the variable nodes updated by the one check node corresponding to reference addresses stored in one row of a quasi-cyclic (QC) H matrix, the QC H matrix being stored in the decoder and representing an LDPC code for encoding and decoding the LDPC codeword.

In yet a further embodiment of the present disclosure, the method comprises: performing a memory address lookup of reference addresses in the one QC H matrix row; and loading, from the memory to the soft-decision decoder, in one memory clock cycle, a first set of variable node values corresponding to a first group of check node constraints in the QC H matrix row.

In yet a further embodiment of the present disclosure, the method comprises loading, from the memory to the soft-decision decoder, a second set of variable node values corresponding to a second group of check node constraints in the QC H matrix, concurrently to loading the first set of variable node values in the same one memory clock cycle.

In yet a further embodiment of the present disclosure, the method comprises: receiving at least two variable node values at a shift processor from the two sets of variable node values; providing the first of the two variable node values to a layer processor and subsequently providing the second of the two variable node values to the layer processor, if the first of the two variable node values corresponds to the first check node constraint and the second of the two variable node values corresponds to the second check node constraint; and providing the second of the two variable node values to the layer processor and subsequently providing the first of the two variable node values to the layer processor, if the second of the two variable node values corresponds to the first check node constraint and the first of the two variable node values corresponds to the second check node constraint.

In yet a further embodiment of the present disclosure, the method comprises: receiving all of the variable node values of the one check node at the layer processor; removing previous extrinsic information relating to the check node from all of the variable node values to form a check node processor input information; calculating a belief propagation function at a check node processor to determine extrinsic information relating to the check node; storing the calculated extrinsic information relating to the check node; and combining the check node processor input information with the extrinsic information relating to the check node to update the variable node values of the check node.

In yet a further embodiment of the present disclosure, the method comprises: receiving, from at least one layer processor, two updated variable node values at a reorder buffer; providing the first of the two updated variable node values to the memory and subsequently providing the second of the two updated variable node values to the memory, in a first minor shift condition; and providing the second of the two updated variable node values to the memory and subsequently providing the first of the two updated variable node values to the memory, in a second minor shift condition.

In another embodiment of the present disclosure, a decoder for decoding an error correcting code (ECC) codeword comprises: a memory for receiving the ECC codeword, the received ECC codeword comprising ECC data bits, ECC parity bits, and error detection code bits; a soft-decision decoder for soft-decision decoding the received ECC codeword stored in the memory to update the ECC codeword according to ECC parity check equations; and a hard-decision processor for hard-decision processing the received ECC codeword stored in the memory, while the soft-decision decoder performs the soft-decision decoding, the hard-decision processor configured to verify the integrity of the ECC data bits using the error detection code bits; terminate the soft-decision decoding when the ECC data bits are verified, regardless of whether the updated ECC codeword satisfies all of the ECC parity check equations; and output the decoded ECC codeword stored in memory after termination of the decoding.

In a further embodiment of the present disclosure, the decoder comprises an exit determiner for: determining a convergence status of the soft-decision decoding; and initiating the hard-decision processing when the convergence status of the soft-decision decoding exceeds a threshold.

In yet a further embodiment of the present disclosure, the hard-decision processor performs further hard-decision processing of the decoded ECC codeword stored in memory after terminating the decoding and before outputting the decoded ECC codeword in order to further verify the ECC data bits; and the soft-decision decoder performs further soft-decision decoding of the decoded ECC codeword stored in memory if the further verification fails.

In yet a further embodiment of the present disclosure, the ECC codeword is a low density parity check (LDPC) codeword comprising LDPC data bits, CRC bits, and LDPC parity bits.

In yet a further embodiment of the present disclosure, the hard-decision processor performs a hard-decision operation comprising: calculating a CRC check value from the LDPC data bits; extracting a CRC check value from the CRC bits; and comparing the calculated CRC check value to the extracted CRC check value.

In yet a further embodiment of the present disclosure, the hard-decision processor performs a hard-decision operation further comprising: calculating at least a portion of parity check equations of an LDPC code with the decoded codeword; and verifying whether the number of successfully calculated parity check equations exceeds a threshold.

In yet a further embodiment of the present disclosure, the soft-decision decoder updates variable node values of the LDPC codeword according to one check node constraint, the variable nodes updated by the one check node corresponding to reference addresses stored in one row of a quasi-cyclic (QC) H matrix, the QC H matrix being stored in the decoder and representing an LDPC code for encoding and decoding the LDPC codeword.

In yet a further embodiment of the present disclosure, the decoder further comprises a plurality of memory elements wherein all variable node values referenced by each column of the QC H matrix are stored in a single memory element.

In yet a further embodiment of the present disclosure, the memory: performs a memory address lookup of reference addresses in the one QC H matrix row; and provides to the soft-decision decoder, in one memory clock cycle, a first set of variable node values corresponding to a first group of check node constraints in the QC H matrix row.

In yet a further embodiment of the present disclosure, the memory provides, to the soft-decision decoder, a second set of variable node values corresponding to a second group of check node constraints in the QC H matrix, concurrently to providing the first set of variable node values in the same one memory clock cycle.

In yet a further embodiment of the present disclosure, the decoder further comprises: a shift processor for receiving at least two variable node values from the two sets of variable node values; and a layer processor for updating the two variable node values, the shift processor configured to: provide the first of the two variable node values to the layer processor and subsequently provide the second of the two variable node values to the layer processor, if the first of the two variable node values corresponds to the first check node constraint and the second of the two variable node values corresponds to the second check node constraint; and provide the second of the two variable node values to the layer processor and subsequently provide the first of the two variable node values to the layer processor, if the second of the two variable node values corresponds to the first check node constraint and the first of the two variable node values corresponds to the second check node constraint.

In yet a further embodiment of the present disclosure, the decoder further comprises a plurality of shift processors wherein each shift processor receives variable nodes from a different column of the QC H matrix.

In yet a further embodiment of the present disclosure, the layer processor further comprises: an input for receiving all of the variable node values of the one check node; a first adder for removing previous extrinsic information relating to the check node from all of the variable node values to form a check node processor input information; a check node processor for calculating a belief propagation function to determine extrinsic information relating to the check node; a delay element for storing the calculated extrinsic information relating to the check node; and a second adder for combining the check node processor input information with the extrinsic information relating to the check node to update the variable node values of the check node.

In yet a further embodiment of the present disclosure, the decoder further comprises: a reorder buffer for receiving, from at least one layer processor, two updated variable node values, the reorder buffer configured to: provide the first of the two updated variable node values to the memory and subsequently provide the second of the two updated variable node values to the memory, in a first condition; and provide the second of the two updated variable node values to the memory and subsequently provide the first of the two updated variable node values to the memory, in a second condition.

Reference to specific elements of various embodiments of the present disclosure will now be made.

FIG. 1 shows an exemplary known LDPC H matrix 100. The H matrix is used for encoding and decoding an LDPC codeword, and describes the connections between the data and the parity. The connections represented by the H matrix can also be represented graphically as a Tanner graph (not shown), which shows variable nodes and check nodes used to represent the decoding of an LDPC codeword.

The rows 102 of H matrix 100 are often equated to the check nodes in a Tanner graph because each row represents a constraint in the decoding, and each check node represents a constraint on connected variable nodes. Consequently, there are as many rows in an H matrix as there are check nodes in a Tanner graph.

Since the rows represent the constraints on the bits of the LDPC codeword, there are as many columns in H matrix 100 as there are bits (both data bits and parity bits) in the LDPC codeword. The columns of H matrix 100 generally equate to the function of the variable nodes in the Tanner graph. Each constraint (row value) in a given column helps generate a belief value, and the sum of all of the belief values in a column generates an updated variable node, or an updated codeword bit.

H matrix 100 corresponds to an LDPC codeword having N data bits and M parity bits. Therefore, H matrix 100 has N number of data columns 104 and M number of parity columns 106, representing the entire length of the LDPC codeword. H matrix 100 also has M number of rows 102, representing the length of the parity portion of the LDPC codeword.

FIG. 2 shows an exemplary known Quasi-Cyclic (QC) H matrix 200 used for decoding QC LDPC codes. QC LDPC codes are a subclass of LDPC codes that are generally easier to implement and generally more efficient for encoding and decoding LDPC codewords. QC H matrix 200 has $N_D$ number of data columns, $N_P$ number of parity columns, and $N_P$ number of rows. Each entry in matrix 200 includes a circulant matrix.

Figure 3:
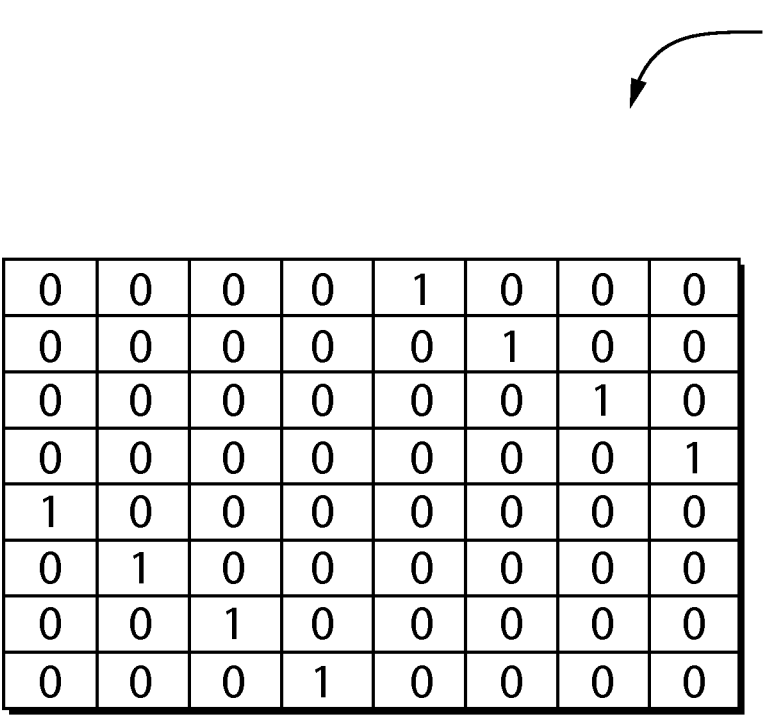
FIG. 3 shows an exemplary known circulant matrix used in a QC H matrix.

FIG. 3 shows an exemplary known circulant matrix 300 used in QC H matrix 200. A circulant matrix is a Q×Q sized matrix having the following entries: either an identity matrix that has been rotated between '0' and 'Q−1', or an all-zero matrix. Circulant matrix 300 has size Q=8 a rotation of 4. Referring to FIGS. 2 and 3, each entry in QC H matrix 200 is a circulant matrix. A '−1' entry in QC H matrix 200 corresponds to an all-zero circulant matrix. A '0' entry in QC H matrix 200 corresponds to an identity circulant matrix. A positive integer entry in QC H matrix 200 corresponds to a rotated identity matrix circulant matrix. Thus, entries 201 in QC H matrix 200 correspond to circulant matrix 300.

Every row and column in a non-zero circulant matrix, such as circulant matrix 300, has a weight of one; that is, it contains only a single '1' entry in each row and column. This characteristic of QC H matrices beneficially provides for easier encoder and decoder implementation. Specifically, this characteristic allows for implementing a QC H matrix in which some rows are orthogonal to each other. Rows in a QC H matrix are orthogonal to each other where each column has at most one entry with a value greater than '−1'. That is, each column, in a group of orthogonal rows, has at most one non-zero circulant matrix. In QC H matrix 200 in FIG. 2, rows R1, R2, R3, and R4 are orthogonal to each other, and together form a layer 202. Similarly, rows R5 and R6 are also orthogonal, and together form a layer 203. Multi-row layers 202 and 203 can reduce decoder iterations because the orthogonality of the rows in each of the layers allows the rows in the layers to be processed in parallel by separate layer processors.

Figure 4:
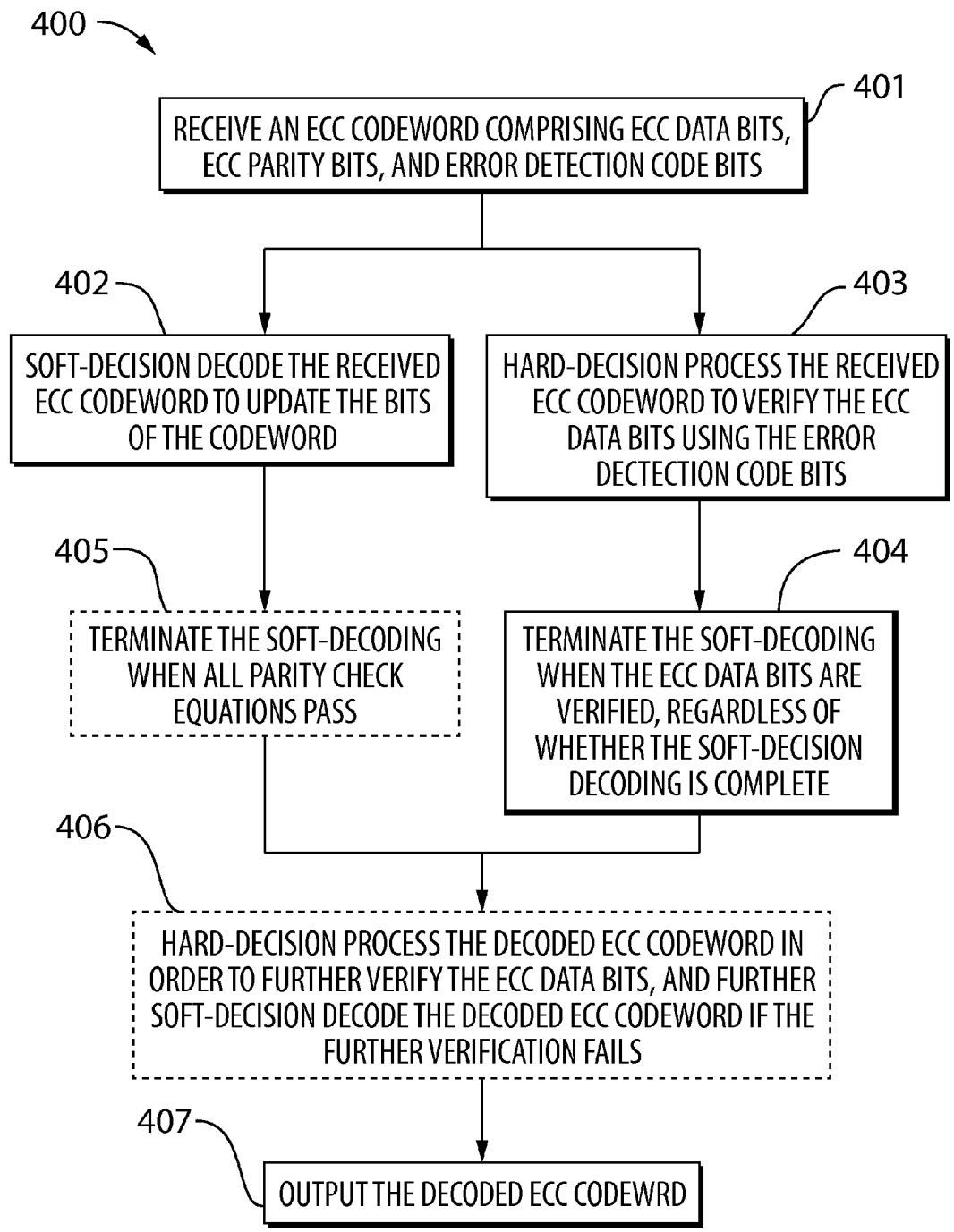
FIG. 4 is a flowchart illustrating a method of decoding an LDPC codeword according to an embodiment of the present disclosure.

FIG. 4 is a flowchart illustrating a method 400 for decoding an error correcting code (ECC) codeword according to an embodiment of the present disclosure. At 401, method 400 receives a codeword comprising ECC data bits, ECC parity bits, and error detection code bits. A soft-decision decoder, at 402, decodes the received codeword, while at the same time and in parallel, at 403, a hard-decision processor processes the received codeword according to a hard-decision determination.

Soft-decision decoding at 402 comprises updating the bits of the codeword. Each bit of the codeword is exemplarily an m-bit soft-value, representing the amount of confidence that the bit is either a '0' value or a '1' value. Thus, updating exemplarily comprises iteratively updating the soft-values, or variable nodes, according to the check node constraints, or parity check equations, of the error correcting code. As the soft-values are iteratively updated, more and more constraints of the error correcting code will be satisfied by the set of soft-values representing the codeword being decoded.

In a further embodiment, method 400 comprises determining when to initiate hard-decision processing at 403. In this embodiment, soft-decision decoding is first initiated to decode the codeword. As the codeword is iteratively decoded, its decoding status is compared to a completion threshold. Once the completeness of the decoding exceeds the threshold, the hard-decision processing is initiated at 403. Delaying the initiation of the hard-decision processing further reduces overall decoder power consumption.

Furthermore, delaying the initiation of the hard-decision processing reduces the chance of a false convergence. Soft-decision decoding at 402 can randomly generate a false codeword having internally consistent ECC data bits and error detection code bits. By choosing a sufficient completion threshold, method 400 will reduce the chance that hard-decision processing at 403 terminates the decoding based on a false codeword.

Hard-decision processing at 403 comprises verifying the ECC data bits using the error detection code bits. Verifying can comprise, for example, a CRC check that the value of the received error detection code bits matches an error detection code value calculated from the received ECC data bits.

At 404, in response to a successful verification that received error detection code bits match the error detection code bits calculated from the received ECC data bits, method 400 terminates the soft-decision decoding. Step 404 terminates the soft-decision decoding of the received codeword regardless of whether the updated codeword satisfies all of the parity check equations of the error correcting code.

In an embodiment, method 400 optionally proceeds to 406 to process the decoded codeword at the hard-decision processor once again. The soft-decision decoding and the hard-decision processing proceed in parallel using different address sequences but reference the same memory space; thus, there exists a possibility that the soft-decision decoding at 402 altered a bit of the decoded codeword between the hard-decision processing at 403 and the terminating at 404. The second processing operation at 406 verifies that the soft-decision decoding at 402 did not alter any bits of the decoded codeword between the hard-decision processing at 403 and the terminating at 404. If the second verification at 406 fails, the codeword decoded at 402 is further soft-decision decoded to correct any bits altered between the hard-decision process at 403 and the terminating at 404.

Method 400 outputs the decoded codeword at 407.

In a further embodiment, method 400 optionally includes step 405 comprising terminating the soft-decision decoding when the entire codeword (ECC data bits, ECC parity bits, and error detection code bits) satisfies all of the check node constraints of the error correcting code. That is, all of the parity check equations associated with the check nodes are passing. After optional step 405, method 400 proceeds to 406 to output the decoded codeword. In this embodiment, optional step 405 is usually skipped because parallel step 404 usually terminates the soft-decision decoding before optional step 405. This condition is informally known as an early exit of the soft-decision decoding operation.

In addition to allowing for the early exit at 404, hard-decision processing at 403 advantageously provides verification that the decoded codeword is not a false convergence. Soft-decision decoding at 402 can also randomly generate another type of false codeword having internally consistent ECC data bits and ECC parity bits. While a particular ECC code can be selected to minimize the occurrence of false ECC codewords, this rare occurrence will still exist. Since the false codeword will not likely also have internally consistent ECC data bits and error detection code bits, hard-decision processing at 403 will provide detection for this type of false codeword.

In an embodiment, the ECC codeword is an LDPC codeword, and the LDPC codeword comprises LDPC data bits, CRC bits, and LDPC parity bits. However, embodiments described herein are applicable to any type of ECC codeword. While detailed examples are provided herein with respect to LDPC and CRC codes, in other embodiments similar approaches are implemented with respect to other types of error correcting and error detecting codes.

Figure 5:
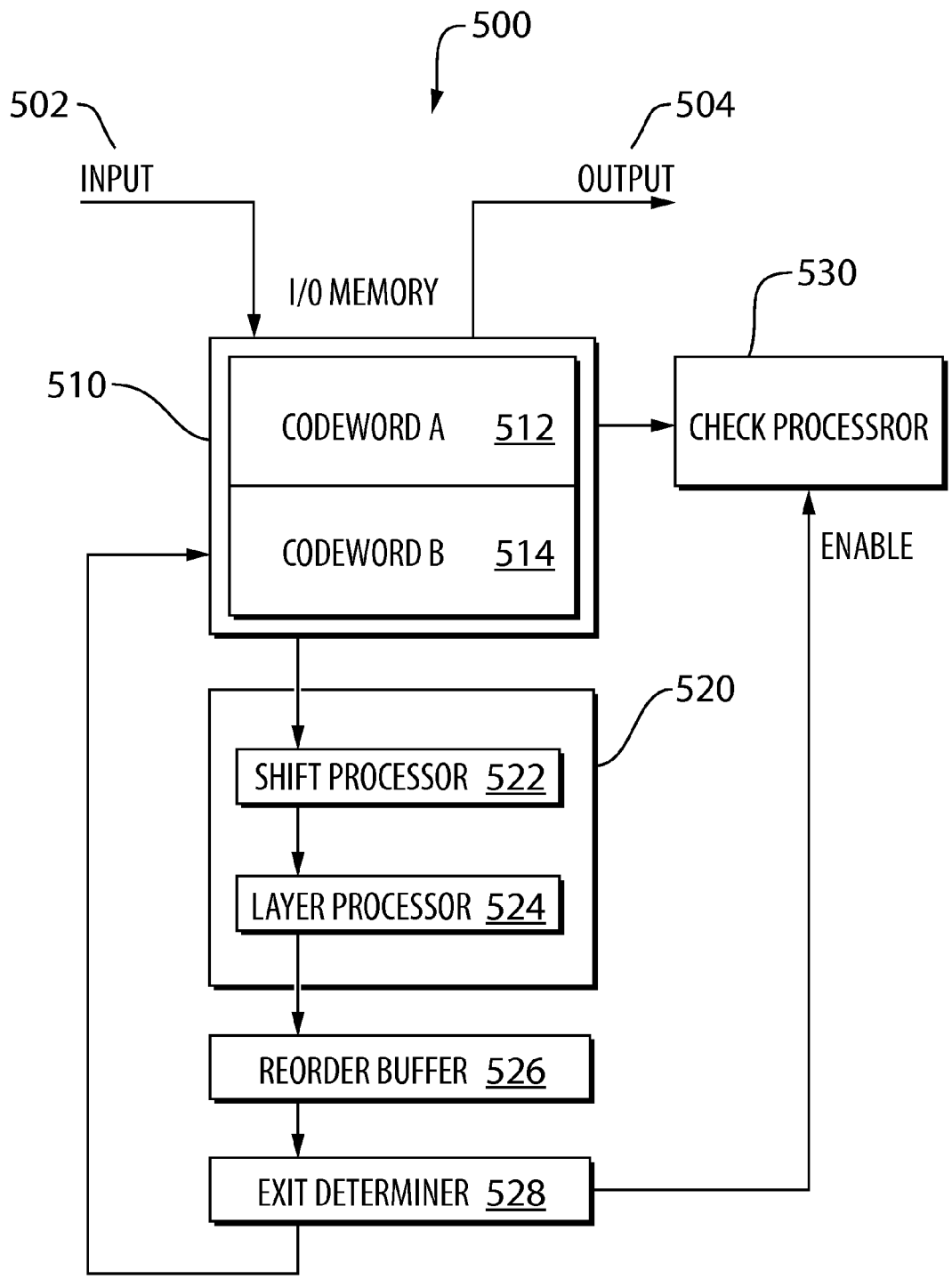
FIG. 5 is a block diagram of an LDPC decoder according to an embodiment of the present disclosure.

FIG. 5 is a block diagram of a decoder 500 for decoding an LDPC codeword 512, 514, according to an embodiment of the present disclosure. Decoder 500 comprises a memory 510 for receiving the LDPC codeword 512, 514, a soft-decision decoder 520 for soft-decision decoding the received LDPC codeword 512, 514, stored in the memory 510, and a hard-decision processor 530 for verifying the LDPC codeword 512, 514, stored in memory 510, while the soft-decision decoder 520 performs the soft-decision decoding. LDPC codeword 512, 514, comprises LDPC data bits, LDPC parity bits, and CRC bits. Hard-decision processor 530 may also be referred to as check processor 530, and is configured to terminate both the soft-decision decoding and the hard-decision processing when the CRC check value calculated from the LDPC data bits matches the CRC check value stored in the CRC bits, and to output the decoded LDPC codeword 512, 514, stored in memory 510 after termination of the decoding. Therefore, decoder 500 will output the LDPC codeword even when the soft-decision decoder has not completed decoding the entire LDPC codeword (i.e., not all check node constraints are passing). This operation reduces the power consumption of decoder 500.

Since only the LDPC data bits are considered the payload of the codeword, and the LDPC data bits can be verified by the CRC bits, decoder 500 can ignore the correctness of the LDPC parity bits. Thus, decoder 500 can terminate the decoding and output the codeword upon verifying the LDPC data bits with the CRC bits only. In other words, decoder 500 will use the LDPC parity bits to converge the entire codeword at soft-decision decoder 520, in order to correct the LDPC data bits and the CRC bits, but does not necessarily require that the converging codeword correct the LDPC parity bits.

In addition to causing an early exit of the decoding, check processor 530 advantageously provides verification that the decoded codeword is not a false convergence. Soft-decision decoder 520 can randomly generate a type of false codeword having internally consistent LDPC data bits and LDPC parity bits. While a particular LDPC code can be selected to minimize the occurrence of false LDPC codewords, this rare occurrence will still exist. Since the false LDPC codeword will not likely also have internally consistent LDPC data bits and CRC bits, check processor 530 will also provide detection for this type of false codeword.

Decoder 500 further comprises exit determiner 528 to enable the operation of hard-decision processor 530 only once the codeword is nearly ready for hard-decision processing, which further reduces the power consumption of decoder 500.

In operation, the LDPC decoder input 502 receives an LDPC codeword for decoding. The input is connected to an input/output (IO) memory 510 in order to load the LDPC codeword into the memory. IO memory 510, for example, is sized to hold two codewords: codeword A 512 and codeword B 514. I/O memory 510 is connected to an output 504 for outputting the decoded LDPC codeword.

IO memory 510 is also connected to both an LDPC soft-decision decoder 520 and to a hard-decision processor 530. In an example embodiment, the memory 510 has sufficient bandwidth to serve data to both the soft and the hard processors in parallel. LDPC soft-decision decoder 520 performs soft-decision decoding operations on the codeword to decode the codeword, over several soft-decision decoding iterations, to obtain a corrected codeword. Check processor 530 can perform convergence checking operations on the codeword to check the correctness of the codeword while the soft-decision decoder 520 performs the soft-decision decoding. LDPC soft-decision decoder 520 comprises a shift processor 522 and a layer processor 524. The shift processor performs a cyclic shift of a circulant 300 stored in the memory. The layer processor processes one layer, such as layer 202 comprising a number of orthogonal rows of the H matrix 200, in a single soft-decision decoding iteration.

The decoder input 502 and output 504 are connected to IO memory 510 and are not directly connected to soft-decision decoder 520. Therefore, the overall input/output rate of decoder 500 does not have to match the rate of soft-decision decoder 520, which is typically much higher than the input/output rate of decoder 500. This simplifies the external input/output circuitry for connecting decoder 500 to other circuits.

The following expressions, provided with corresponding definitions, are used throughout the detailed description to describe the decoder and the decoding method:

$H_{R,C}$: Shift value in the Quasi-Cyclic H matrix in Layer R and Column C $N_D$: Number of data columns in H matrix $N_P$: Number of parity columns in H matrix $N_C$: Number of columns in H matrix (note that $N_C=N_D+N_P$)

Q: Expansion factor on Quasi-Cyclic H matrix

L: Number of layer processors in the device $F_P$: Fractional shift remainder $L_C$: Number of clock cycles in a layer (note that $L_C=Q/L$)

The decoder 500 operates by evaluating L check nodes per clock where each check node is one element of a row in H matrix 200. Because each entry in H matrix 200 includes a circulant matrix 300, each row in H matrix 200 includes Q sub-rows, or elements. Therefore, decoder 500 can evaluate one row of H matrix 200 every Lc clock cycles In an embodiment, soft-decision decoder 520 performs variable and check node operations on all soft-values of the codeword read from IO memory 510 and writes back the updated soft-values continuously to IO memory 510. On each layer boundary, the soft decoder finishes and writes back into IO memory 510 a current layer before beginning to process the next layer. Each value in memory 510 represents the summation of the channel information and the extrinsic information obtained from each row, that is $$V_C(t) = \text{channel} + \sum_{r=1}^{R} \text{extrinsic}_{C,r}$$

As shown in the embodiment of FIG. 5, codeword memory 510 can hold two LDPC codewords (A 512 and B 514) of information. For high speed decoding, storing two codewords of information in the memory is often favorable since the aspect ratio of the memories results in a nominal increase in gate area (on the order of 25% or less) to store twice the data. Each codeword memory 510 is composed of several hardware memory elements. Each circulant 300 is a Q×Q matrix in memory 510 and each '1' entry in circulant 300 is a reference to a codeword soft value stored in memory 510. Therefore, each circulant contains Q soft value references. Each soft value is described by M bits of information in codeword memory 510. Thus, the bit depth M describes the precision of decoder 500. Bit depth M can be used for representing soft value information as a log likelihood ratio. Since circulant 300 is orthogonal, no two soft value references of circulant 300 are ever accessed at the same time; therefore, all of the codeword data referenced by one circulant 300 in Quasi-Cyclic H matrix 200 is stored in a single hardware memory element. Thus, the number of hardware memory elements in the codeword memory is equal to the number of columns in QC-H matrix 200.

Furthermore, IO memory 510 holds two LDPC codewords 512, 514. Each hardware memory element stores all of the codeword data referenced by a circulant of codeword 512 as well as all of the codeword data referenced by a circulant of codeword 514. The bandwidth of each hardware memory element is effectively shared between codewords 512 and 514. Thus, in an exemplary embodiment, the memory bandwidth from the codeword memory is configured to ensure sufficient bandwidth to support both LDPC soft-decision decoder 520 and check processor 530 (i.e. input, output and exit determination processing) without stalling either the soft-decision decoding or the hard-decision processing. For example, effectively half of the available memory bandwidth is available to the soft-decision decoding and half is available to the hard-decision processing. In order to ensure sufficient bandwidth to support both soft-decision decoder 520 and check processor 530, decoder 500 is configured to alternate soft-decision decoding and hard-decision processing of codewords 512 and 514. Therefore, when IO memory 510 is occupied by decoder input, decoder output, and check processor loading operations on codeword 512 (i.e., IO memory 510 is unavailable to soft-decision decoder 520), soft-decision decoder 520 is not necessarily idle because soft-decision decoder 520 can perform soft-decision decoding on codeword 514. Similarly, when IO memory 510 is occupied with codeword 514, soft-decision decoder 520 can operate on codeword 512. This allows soft-decision decoder 520 to be operational 100% of the time so long as there is a new codeword available in IO memory 510 to be processed.

In an embodiment of the present disclosure, each codeword memory 510 comprises $N_C$ hardware memory elements where each memory element is a two-port memory supporting one write and one read per clock cycle. Typically these memories will be implemented as two-port register files. In an embodiment, decoder 500 supports up to 2L M-bit soft value reads from each hardware memory element and 2L M-bit soft value writes to each hardware memory element per clock cycle, where M is the precision of layer processor 524. The reads on the even clock cycles are routed to shift processors 522 and the reads on the odd clock cycles are routed to check processor 530, or to data output 504 if the LDPC decoder has completed processing. The writes on the even clock cycles are routed from layer processor 524 and the writes on the odd clock cycles are routed from data input 502. Each column's even clock cycle read address, destined for shift processor 522, is defined by the following equation:

$$A_C(t) = \begin{cases} \dfrac{H_{R,C}}{2L}, & t = 0 \\ (A_C(t-1)+1)\bmod\left(\dfrac{Q}{2L}\right), & 0 < t < \dfrac{Q}{2L} \end{cases}$$

$A_C$ is the address in the column C IO memory 510 hardware memory element (note that $0 < C \leq N_C$) and t is the time step within the layer. This addressing formula performs the first part of the QC-H matrix shifting. That is, it performs address lookup based on the shift value in Quasi-Cyclic H matrix 200.

The write address to IO memory 510 from layer processor 524 is defined by the following equation:

$$A_C(t) = \begin{cases} \dfrac{H_{R,C}}{2L}, & t = 0, H_{R,C}\bmod(2L) = 0 \\ \left(\dfrac{H_{R,C}}{2L}+1\right)\bmod\left(\dfrac{Q}{2L}\right), & t = 0, H_{R,C}\bmod(2L) \neq 0 \\ (A_C(t-1)+1)\bmod\left(\dfrac{Q}{2L}\right), & 0 < t < \dfrac{Q}{2L} \end{cases}$$

An L to 2L reorder buffer 526 is placed between the layer processor and the codeword memory to convert the L per clock output from layer processor 524 to a 2L wide value that can be written back to IO memory 510. The total storage in reorder buffer 526 is 3L−1 soft values; L soft value storage elements hold the results from the L layer processors 524 on the odd clock cycle. On the even clock cycle, the L layer processor 524 outputs are combined with the stored L values from the odd clock cycle to form a 2L wide value that can be written back to IO memory 510.

In a further embodiment, reorder buffer 526 comprises an additional $F_P = H_{R,C} \bmod(2L)$ storage elements used to save the first $F_P$ outputs from layer processor 524 (in the worst case $F_P = 2L-1$). These $F_P$ stored values are combined with the last $2L - F_P$ values and written back to IO memory 510 on the final clock cycle of the layer. Note that when $F_P$ is zero the additional $F_P$ elements of reorder buffer 526 holds no elements. Reorder buffer 526 reverses the operation of shift processor 522 in order to return the updated codeword data to IO memory 510.

The write address to IO memory 510 from data input 502 is defined by the following equation:

$$A_C(t) = \begin{cases} 0, & t = 0 \\ (A_C(t-1)+1)\bmod\left(\dfrac{Q}{2L}\right), & 0 < t < \dfrac{Q}{2L} \end{cases}$$

The write address equation is equivalent to writing the input values to IO memory 510 in the order they are received at data input 502.

In an embodiment, decoder 500 includes exit determiner 528 for determining when to initiate hard-decision processing at check processor 530. In this embodiment, soft-decision decoding is first initiated to decode the LDPC codeword at soft-decision decoder 520. As the codeword is iteratively decoded, exit determiner 528 compares its decoding status to a completion threshold. Once the progress of the decoding exceeds the threshold, exit determiner 528 initiates hard-decision processing at check processor 530. Selectively enabling the operation of check processor 530 further reduces overall decoder power consumption.

In an example embodiment, exit determiner 528 keeps track of the passing check node count as provided by layer processor 524. For each layer processed at layer processor 524, a count is maintained of the number of check nodes that have passed; summing this total over all the layers of the codeword provides the total number of passing check nodes for that codeword. This total is compared against a threshold, which is typically set to between 95 and 99% of the total number of check nodes. Advantageously, a high threshold reduces the chance of a false convergence. Soft-decision decoder 520 can generate a type of false codeword having internally consistent LDPC data bits and CRC bits. Though the codeword being decoded at soft-decision decoder 520 may be incorrect, check processor 530 may nevertheless indicate a CRC pass. By choosing a sufficiently large completion threshold, such as between 95 and 99%, exit determiner 528 will reduce the chance that check processor 530 terminates the decoding based on a false codeword.

Figure 6:
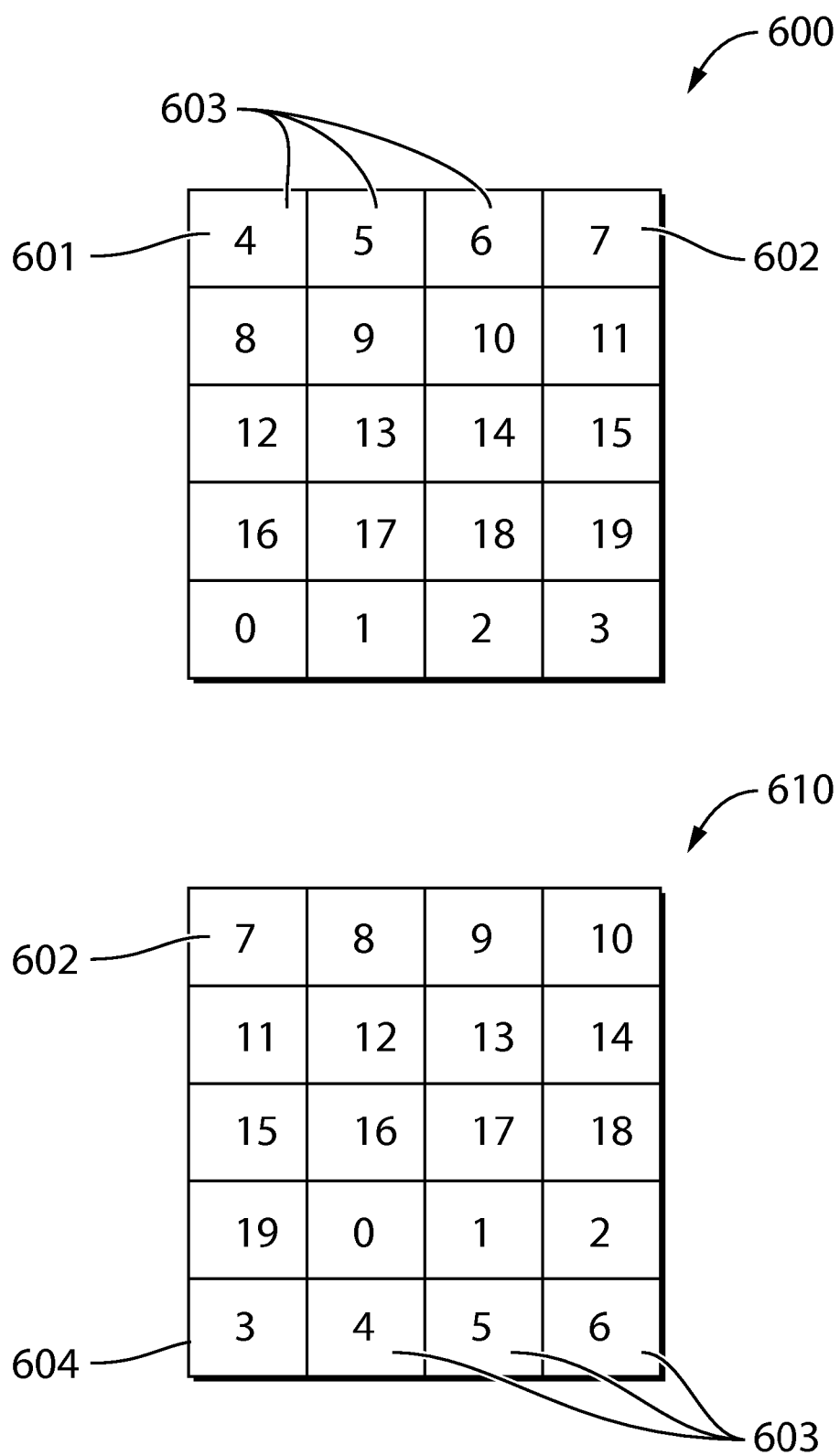
FIG. 6 is a diagram illustrating the operation of a shift processor according to an embodiment of the present disclosure.

FIG. 6 is a diagram illustrating the operation of an exemplary shift processor 522 according to an embodiment of the present disclosure. Shift processor 522 performs the second part of the QC-H matrix shifting in order to present the correct codeword elements to the input of layer processor 524. The first part of presenting the correct codeword to layer processor 524 is the address lookup and translation step described in relation to the operation of IO memory 510.

Depending on the shift value $H_{R,C}$ stored in an entry of QC H matrix 200, the second shift performed by shift processor 522 may or may not be necessary. Shift value $H_{R,C}$ describes the address of the first M-bit soft value in each hardware memory to be processed at layer processor 524. Because 2L M-bits are read from each hardware memory element, the M-bit soft value specified by shift value $H_{R,C}$ may or may not be at the beginning of the 2L M-bits read from memory. In the case of an $H_{R,C}$ shift value wherein the specified M-bit soft value is at the beginning of the 2L M-bits read from memory, a shift will not be necessary. In the case of an $H_{R,C}$ shift value wherein the specified M-bit soft value is not at the beginning of the 2L M-bits read from memory, a shift will be necessary. Therefore, shift processor 522 removes the first unused M-bits read from memory, and stores those M-bits for appending to the last bits sent to layer processor 524.

Shift processor 522 receives 2L M-bit soft values every second clock cycle from IO memory 510 and provides L M-bit outputs every clock cycle to layer processor 524. In order to keep the routing distance for shift processor 522 as short as possible, the shifting distance is at most 2L elements. Shift processor 522 completes the shift operation initiated by the IO memory read. IO memory 510 performs the macro shift by accessing the memory address as described above, and shift processor 522 performs the minor shift. The minor shift is calculated by:

$$F_P = H_{R,C} \mod(2L)$$

Shift processor 522 also handles the stitching of the beginning of the shift to the end, required for a cyclic shift. FIG. 6 demonstrates the operation of shift processor 522. A and B are a number of elements adding up to 2L and are calculated as:

$$A = F_P$$

$$B = 2L - F_P$$

In the example of FIG. 6, decoder 500 includes two layer processors and QC H matrix 200 is constructed with circulant size twenty. Therefore, L=2 and Q=20. Shift value $H_{R,C}$ specified in the matrix 200 entry 204 is 7. Thus, the minor shift remainder, $F_P$, is 3. Table 600 shows the indexes of memory addresses accessed from a hardware memory element associated with a single circulant before the minor shift. Each row identifies a memory address lookup and translation performed by IO memory 510 and the entire content of each row is sent to shift processor 522. Row 601 represents the first memory read. However, shift value $H_{R,C}$ specified a shift of 7 which represents the contents of 602. Therefore, shift processor 522 calculates the minor shift remainder $F_P$=3 and stores the contents 603. These contents 603 are appended to the last data transfer to layer processor 524, as shown below.

Table 610 shows the indexes of memory addresses accessed from a hardware memory element associated with a single circulant after the minor shift. The content of 602 is now at the beginning of the data presented to layer processor 524 and corresponds correctly to shift value $H_{R,C}$=7 specified in matrix 200 entry 204. The contents in the remainder 603 are appended to the end of the last row 604, representing the last data transfer to the layer processor 524 for this particular circulant.

Figure 7:
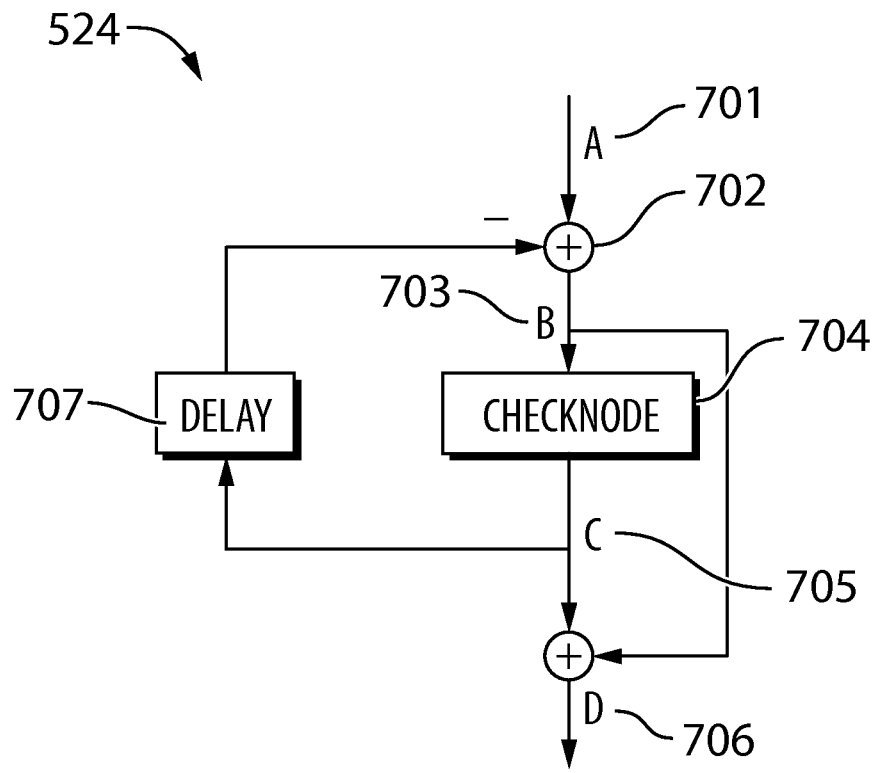
FIG. 7 is a block diagram of a layer processor according to an embodiment of the present disclosure.

FIG. 7 is a block diagram of layer processor 524 according to an embodiment of the present disclosure. Layer processor 524 processes several check nodes in parallel on the shifted input data. In a single pass, layer processor 524 performs both the check node and variable node processing steps for a single layer (e.g. layer 202). According to embodiments of the present disclosure, it is never necessary to stall layer processor 524 while loading or unloading the codeword data being processed.

Point A 701 is the summation of the channel and all extrinsic values for a given column C in QC-H matrix 200, that is $A = V_C(t)$. The adder 702 between point A 701 and point B 703 removes the extrinsic information for the row currently being operated on. Point B 703 represents the channel information, plus the extrinsic information for all rows except the row currently being operated on. Point B 703 can be defined by the formula $B(t) = V_C(t) - C_{C,r}(t)$ where $C_{C,r}(t)$ is the check node output of the previous cycle. This calculation ensures that the input to the check node does not contain previous check node output for the same row. Check node 704 output, point C 705, is calculated based on the following equation:

$$C_{C,r}(t+1) = f\left(\min_{j=1,N_C} B_{C,j}(t)\right)$$

Where f is an approximation of belief propagation function and where $0 < j \le N_C$ and $j \ne r$. Common approximation functions include minsum adjust, attenuated minimum, and others as described in, for example, *Channel Codes: Classical and Modern*, by W. Ryan and S. Lin, Cambridge University Press, 2009; and in *Error Control Coding*, by S. Lin and D. J. Costello Jr., Pearson Press, 2004. The output of layer processor 524, point D 706, represents the channel information, plus the extrinsic information for all rows except the row currently being operated on, plus the updated extrinsic information for the row being processed. Point D 706 is defined by the formula $D(t+1) = V_C(t) - C_{C,r}(t) + C_{C,r}(t+1)$. Delay element 707 stores the updated extrinsic information for the current column and row and saves it for the next time this column is processed, thus forming the data at point B 703.

The variable node update operation of layer processor 524 is performed by the adders surrounding check node 704: adder 702 and the adder 708. The variable node update operation is the summation of all votes on a given column of H matrix 200. The value at point A 701 represents the summation of all historical votes on a given column of H matrix 200. Before performing a check node operation on a variable node value at check node 704, layer processor 524 first subtracts the previous contribution of check node 704 at adder 702. After the check node operation, layer processor 524 adds the updated contribution from check node 704 to the partial value at point B 703, again creating a full variable node value. The output at point D 706 is the updated variable node value.

Figure 8:
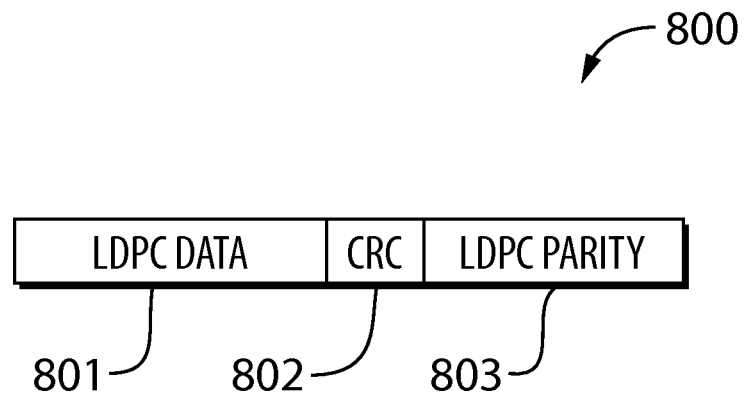
FIG. 8 is a diagram of an LDPC codeword including a CRC according to an embodiment of the present disclosure.

FIG. 8 is a diagram of an LDPC codeword 800 according to an embodiment of the present disclosure. LDPC codeword 800 comprises an LDPC data portion 801, a CRC portion 802, and an LDPC parity portion 803. LDPC soft-decision decoder 520 converges the entire codeword 800 (that is, the LDPC data portion 801, the CRC portion 802, and the LDPC parity portion 803) during the soft-decision decoding. Therefore, errors in the LDPC data portion 801, the CRC portion 802, and the LDPC parity portion 803 will be corrected during the soft-decision decoding operation.

Check processor 530, however, distinguishes between the LDPC data portion 801 and the CRC portion 802. Check processor 530 performs the hard-decision processing operation by calculating a CRC check on the LDPC data portion 801 and comparing it to the CRC portion 802 of codeword 800.

Every two clock cycles, check processor 530 is updated with 2L number of sign bits from each hardware memory element in IO memory 510. In an embodiment of the present disclosure, only LDPC data portion 801 and CRC portion 802 are returned and it is not necessary to return LDPC parity portion 803. In this case it is sufficient to exit the decoding process when LDPC data portion 801 and CRC portion 802 have converged, thereby potentially saving iterations while waiting for LDPC parity portion 803 to converge.

Check processor 530 retrieves LDPC data portion 801 and CRC portion 802 from IO memory 510. Check processor 520 calculates the CRC check value of LDPC data portion 801 and compares the calculated CRC check value of LDPC data portion 801 to the decoded CRC check value contained in CRC portion 802. If check processor 530 determines a match, decoder 500 will terminate the soft-decision decoding iterations, thus saving the overall decoding process from extra decoding iterations. In this embodiment, the read address from each hardware memory element in IO memory 510 is defined by the following equation:

$$A_C(t) = \begin{cases} 0, & t = 0 \\ (A_C(t-1)+1)\bmod\left(\frac{Q}{2L}\right), & 0 < t < \frac{Q}{2L} \end{cases}$$

In a further embodiment, check processor 530 evaluates the codeword by performing a full LDPC parity check in addition to the CRC check described above. The full LDPC parity check comprises checking the entire LDPC codeword (including the LDPC data portion 801, CRC portion 802, and LDPC parity portion 803) according to QC H matrix 200 and evaluating the syndrome of the decoded codeword. In this embodiment, the read address from each hardware memory element in IO memory 510 is defined by the following equation:

$$A_C(t) = \begin{cases} \frac{H_{R,C}}{2L}, & t = 0 \\ (A_C(t-1)+1)\bmod\left(\frac{Q}{2L}\right), & 0 < t < \frac{Q}{2L} \end{cases}$$

Check processor 530 only processes the sign bits from the soft values taken from all of the rows of QC H matrix 200 stored in IO memory 510. Since the soft-decision decoding of codeword 800 was terminated upon the completion of the hard-decision CRC check at check processor 530, it is possible that codeword 800 includes a small number of parity check errors in LDPC parity portion 803; therefore, the full LDPC parity check in the present embodiment may successfully pass while permitting a certain percentage of parity check errors. While the additional full LDPC parity check of the present embodiment provides additional hard-decision checking of codeword 800, the full LDPC parity check requires more processing time as compared to the hard-decision CRC check of check processor 530.

Figure 9A:
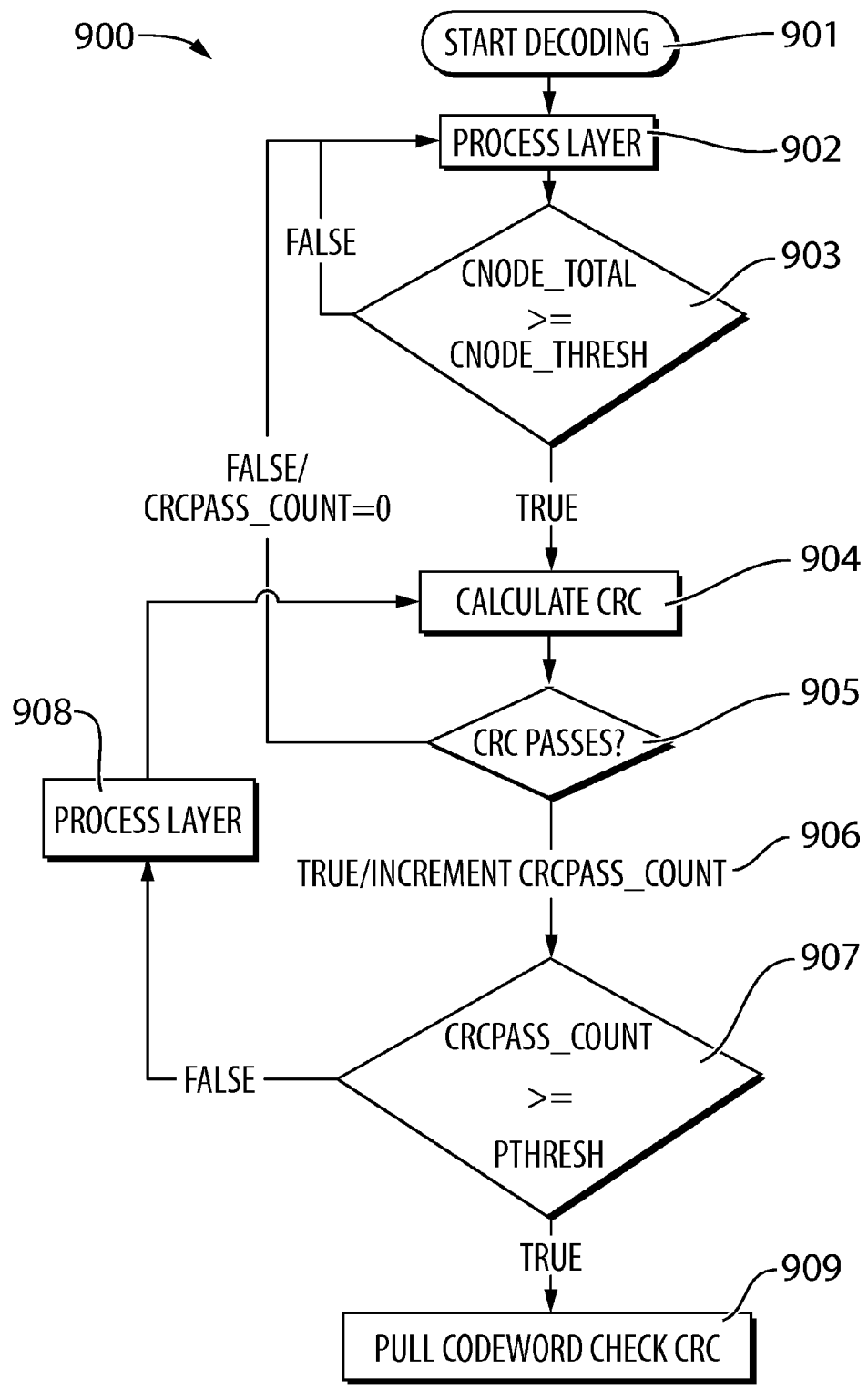
FIGS. 9A and 9B is a flowchart of a method of decoding an LDPC codeword according to an embodiment of the present disclosure.
Figure 9B:
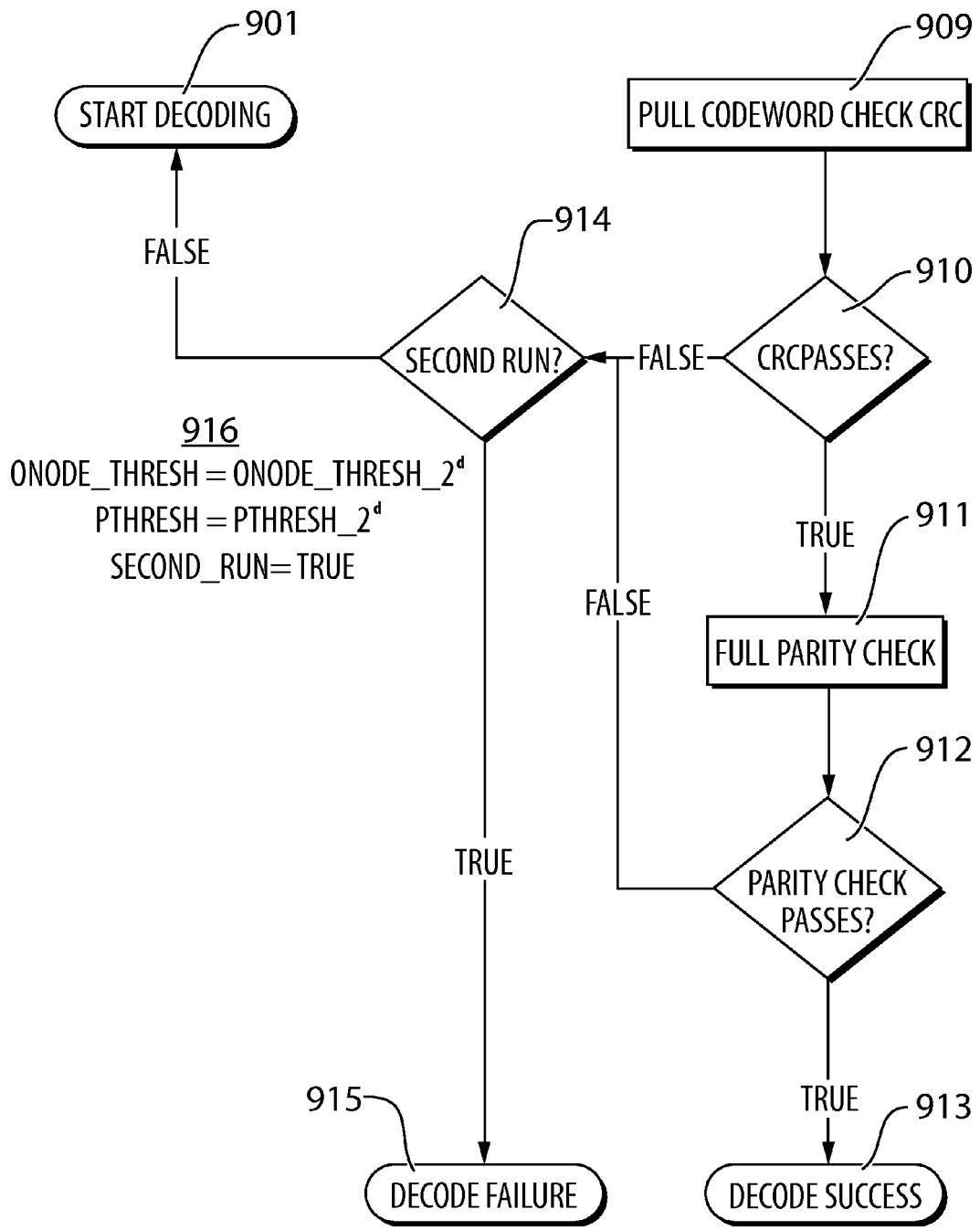

FIGS. 9A and 9B is a flowchart of a method 900 of decoding LDPC codeword 800 according to an embodiment of the present disclosure. With respect to FIG. 9A, method 900 begins at the start of decoding 901. At step 902, layer processor 524 processes a layer of QC H matrix 200. At step 903, decoder 500 determines whether the number of converged check nodes in the layer is greater than or equal to a threshold number or check nodes. If the number of converged check nodes is less than the threshold number, layer processor 524 processes the next layer in sequence. The determination at 903 comprises recording the pass/fail state of each check node processed at 902. The total number of passing check nodes of all layers (Cnode_total) is compared to the threshold number (Cnode_thresh). Once the total number of passing check nodes of all layers exceeds the threshold, method 900 proceeds to step 904, and check processor 530 calculates the CRC check value of the LDPC data portion 801 of LDPC codeword 800. At step 905, check processor 530 compares the CRC calculated at step 904 to the CRC stored in the CRC portion 802 of LDPC codeword 800. If the comparison is successful, method 900 proceeds to step 906; if the comparison is unsuccessful, method 900 returns to step 902, layer processor 524 processes the layer again, and the following steps are repeated.

While steps 901 to 905 are presented in a serialized manner in FIGS. 9A and 9B, processes 902/908 and 904 are performed in parallel in an embodiment of the present disclosure. Referring back to FIG. 4, method 400 shows parallel processes 402 and 403, corresponding to soft-decision decoding and hard-decision processing, respectively. Similarly, processes 902/908 and 904 can be arranged to execute in parallel analogously to processes 402 and 403.

At step 906, a CRC pass count is incremented and method 900 proceeds to step 907. The pass count represents the number of successful CRC comparisons at step 905. At step 907, decoder 500 compares the current CRC pass count to a CRC pass threshold. If the CRC pass count is less than the pass threshold, method 900 proceeds to step 908 and layer processor 524 processes the layer again. After step 908, method 900 returns to step 904 to calculate the CRC of LDPC data portion 801 once again.

If, at step 907, the CRC pass count is greater than or equal to the pass threshold, LDPC codeword 800 is read from IO memory 510 and sent to check processor 530 at step 909 to calculate the CRC of LDPC data portion 801.

Reference is now made to FIG. 9B, which describes the second half of method 900. At step 910, check processor compares the CRC calculated at step 909 to the CRC stored in corrected CRC portion 802. If the two CRC values match, method 900 proceeds to step 913 and declares the decoding operation successful.

In a further embodiment, method 900 includes steps 911 and 912. After check processor 530 matches the two CRC values at step 910, check processor 530 performs a full or partial parity check of codeword 800 by multiplying QC H matrix 200 with codeword 800 to generate a decoding syndrome at step 911 and evaluating the syndrome at step 912. If the evaluation is successful, method 900 continues to step 913. Otherwise, the further embodiment of method 900 proceeds to step 914. Optional steps 911 and 912 demonstrate that LDPC data portion 801 and CRC portion 802 can be decoded successfully (indicated by a successful CRC check at step 910), yet LDPC parity portion 803 can be incompletely decoded (indicated by failed full parity check at steps 911 and 912). Because many applications only require LDPC data portion 801 and discard LDPC parity portion 803, this illustrates how decoder 500 can be used to save decoder processing time.

Returning to step 910, check processor 530 compared the CRC calculated from LDPC data portion 801 to the CRC stored in CRC portion 802. If the CRC values do not match, method 900 also proceeds to step 914. At step 914, decoder 500 reads a second run flag to determine whether codeword 800 had one decoding process or had two decoding processes. If the flag indicates decoder 500 has attempted to decode codeword 800 twice already, method 900 proceeds to step 915 and declares a failed decoding operation.

If decoder 500 has only attempted one decoding operation of codeword 800, decoder 500 proceeds to attempt a second decoding operation at step 916. At 916, the second run flag is asserted, and the check node threshold number used at step 903 and the CRC pass threshold number used at step 907 are increased. Method 900 returns to step 901 to begin a second decoding operation on codeword 800.

Since check processor 530 runs in parallel to shift processor 522 and layer processors 524, this allows the CRC processing for exit determination to proceed asynchronously to the soft-decision LDPC decoding. Due to asynchronous processing it is possible for check processor 530 to signal convergence while layer processor 524 independently triggers a change that would result in a non-convergence state. Therefore, an embodiment of the present disclosure includes additional processing logic to manage these rare events. In this embodiment, check processor 530 can be configured to perform post-exit rechecking on codeword 800 to verify convergence and in these rare cases restart the decoding process to allow convergence to be obtained.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a hardware product implemented in an Integrated Circuit (IC), Programmable Gate Array, or some combination of Integrated Circuit(s), Programmable Gate Array(s), and Software. Those of ordinary skill in the art will appreciate that other functions can also be implemented on such Integrated Circuits or Programmable Gate Arrays.

The above-described embodiments are intended to be examples only. Alterations, modifications and variations can be effected to the particular embodiments by those of skill in the art without departing from the scope, which is defined solely by the claims appended hereto.

What is claimed is:

1. A method for decoding an error correcting code (ECC) codeword, the method comprising:
    receiving the ECC codeword at a memory, the received ECC codeword comprising ECC data bits, ECC parity bits, and error detection code bits;
    soft-decision decoding the received ECC codeword at a soft-decision decoder, to update the ECC codeword according to ECC parity check equations;
    hard-decision processing the received ECC codeword at a check processor, while the soft-decision decoder performs the soft-decision decoding, to verify the ECC data bits using the error detection code bits;
    terminating the soft-decision decoding when the ECC data bits are verified, regardless of whether the updated ECC codeword satisfies all of the ECC parity check equations; and,
    outputting the decoded ECC codeword from the memory after termination of the decoding.

2. The method of claim 1, further comprising:
    determining a convergence status of the soft-decision decoding; and
    initiating the hard-decision processing when the convergence status of the soft-decision decoding exceeds a threshold.

3. The method of claim 1, further comprising:
    hard-decision processing the decoded ECC codeword stored in memory after terminating the decoding and before outputting the decoded ECC codeword in order to further verify the ECC data bits; and
    soft-decision decoding the decoded ECC codeword stored in memory if the further verification fails.

4. The method of claim 1 wherein the ECC codeword is a low density parity check (LDPC) codeword comprising LDPC data bits, CRC bits, and LDPC parity bits.

5. The method of claim 4, wherein hard-decision processing comprises:
    calculating a CRC check value from the LDPC data bits;
    extracting a CRC check value from the CRC bits; and
    comparing the calculated CRC check value to the extracted CRC check value.

6. The method of claim 5, wherein hard-decision processing further comprises:
    calculating at least a portion of parity check equations of an LDPC code with the decoded codeword; and
    verifying whether the number of successfully calculated parity check equations exceeds a threshold.

7. The method of claim 4 wherein soft-decision decoding comprises updating variable node values of the LDPC codeword according to one check node constraint, the variable nodes updated by the one check node corresponding to reference addresses stored in one row of a quasi-cyclic (QC) H matrix, the QC H matrix being stored in the decoder and representing an LDPC code for encoding and decoding the LDPC codeword.

8. The method of claim 7 wherein the soft-decision decoding comprises a macro shift, the macro shift comprising:
    performing a memory address lookup of reference addresses in the one QC H matrix row; and
    loading, from the memory to the soft-decision decoder, in one memory clock cycle, a first set of variable node values corresponding to a first group of check node constraints in the QC H matrix row.

9. The method of claim 8 wherein the loading further comprises loading, from the memory to the soft-decision decoder, a second set of variable node values corresponding to a second group of check node constraints in the QC H matrix, concurrently to loading the first set of variable node values in the same one memory clock cycle.

10. The method of claim 9 wherein the soft-decision decoding further comprises a minor shift, the minor shift comprising:
    receiving at least two variable node values at a shift processor from the two sets of variable node values;
    providing the first of the two variable node values to a layer processor and subsequently providing the second of the two variable node values to the layer processor, if the first of the two variable node values corresponds to the first check node constraint and the second of the two variable node values corresponds to the second check node constraint; and
    providing the second of the two variable node values to the layer processor and subsequently providing the first of the two variable node values to the layer processor, if the second of the two variable node values corresponds to the first check node constraint and the first of the two variable node values corresponds to the second check node constraint.

11. The method of claim 10 wherein the soft-decision decoding comprises:
    receiving all of the variable node values of the one check node at the layer processor;
    removing previous extrinsic information relating to the check node from all of the variable node values to form a check node processor input information;
    calculating a belief propagation function at a check node processor to determine extrinsic information relating to the check node;
    storing the calculated extrinsic information relating to the check node; and
    combining the check node processor input information with the extrinsic information relating to the check node to update the variable node values of the check node.

12. The method of claim 11 further comprising:
    receiving, from at least one layer processor, two updated variable node values at a reorder buffer;
    providing the first of the two updated variable node values to the memory and subsequently providing the second of the two updated variable node values to the memory, in a first minor shift condition; and providing the second of the two updated variable node values to the memory and subsequently providing the first of the two updated variable node values to the memory, in a second minor shift condition.

13. A decoder for decoding an error correcting code (ECC) codeword, the decoder comprising:
a memory for receiving the ECC codeword, the received ECC codeword comprising ECC data bits, ECC parity bits, and error detection code bits;
a soft-decision decoder for soft-decision decoding the received ECC codeword stored in the memory to update the ECC codeword according to ECC parity check equations; and
a hard-decision processor for hard-decision processing the received ECC codeword stored in the memory, while the soft-decision decoder performs the soft-decision decoding,
the hard-decision processor configured to
verify the integrity of the ECC data bits using the error detection code bits;
terminate the soft-decision decoding when the ECC data bits are verified, regardless of whether the updated ECC codeword satisfies all of the ECC parity check equations; and
output the decoded ECC codeword stored in memory after termination of the decoding.

14. The decoder of claim 13, further comprising an exit determiner for:
determining a convergence status of the soft-decision decoding; and
initiating the hard-decision processing when the convergence status of the soft-decision decoding exceeds a threshold.

15. The decoder of claim 13, wherein:
the hard-decision processor performs further hard-decision processing of the decoded ECC codeword stored in memory after terminating the decoding and before outputting the decoded ECC codeword in order to further verify the ECC data bits; and
the soft-decision decoder performs further soft-decision decoding of the decoded ECC codeword stored in memory if the further verification fails.

16. The decoder of claim 13 wherein the ECC codeword is a low density parity check (LDPC) codeword comprising LDPC data bits, CRC bits, and LDPC parity bits.

17. The decoder of claim 16, wherein the hard-decision processor performs a hard-decision operation comprising:
calculating a CRC check value from the LDPC data bits;
extracting a CRC check value from the CRC bits; and
comparing the calculated CRC check value to the extracted CRC check value.

18. The decoder of claim 17, wherein the hard-decision processor performs a hard-decision operation further comprising:
calculating at least a portion of parity check equations of an LDPC code with the decoded codeword; and
verifying whether the number of successfully calculated parity check equations exceeds a threshold.

19. The decoder of claim 16 wherein the soft-decision decoder updates variable node values of the LDPC codeword according to one check node constraint, the variable nodes updated by the one check node corresponding to reference addresses stored in one row of a quasi-cyclic (QC) H matrix, the QC H matrix being stored in the decoder and representing an LDPC code for encoding and decoding the LDPC codeword.

20. The decoder of claim 19 further comprising a plurality of memory elements wherein all variable node values referenced by each column of the QC H matrix are stored in a single memory element.

21. The decoder of claim 20 wherein the memory:
performs a memory address lookup of reference addresses in the one QC H matrix row; and
provides to the soft-decision decoder, in one memory clock cycle, a first set of variable node values corresponding to a first group of check node constraints in the QC H matrix row.

22. The decoder of claim 21 wherein the memory provides, to the soft-decision decoder, a second set of variable node values corresponding to a second group of check node constraints in the QC H matrix, concurrently to providing the first set of variable node values in the same one memory clock cycle.

23. The decoder of claim 22 further comprising:
a shift processor for receiving at least two variable node values from the two sets of variable node values; and
a layer processor for updating the two variable node values,
the shift processor configured to:
provide the first of the two variable node values to the layer processor and subsequently provide the second of the two variable node values to the layer processor, if the first of the two variable node values corresponds to the first check node constraint and the second of the two variable node values corresponds to the second check node constraint; and
provide the second of the two variable node values to the layer processor and subsequently provide the first of the two variable node values to the layer processor, if the second of the two variable node values corresponds to the first check node constraint and the first of the two variable node values corresponds to the second check node constraint.

24. The decoder of claim 23 further comprising a plurality of shift processors wherein each shift processor receives variable nodes from a different column of the QC H matrix.

25. The decoder of claim 24 wherein the layer processor further comprises:
an input for receiving all of the variable node values of the one check node;
a first adder for removing previous extrinsic information relating to the check node from all of the variable node values to form a check node processor input information;
a check node processor for calculating a belief propagation function to determine extrinsic information relating to the check node;
a delay element for storing the calculated extrinsic information relating to the check node; and
a second adder for combining the check node processor input information with the extrinsic information relating to the check node to update the variable node values of the check node.

26. The decoder of claim 25 further comprising:
a reorder buffer for receiving, from at least one layer processor, two updated variable node values, the reorder buffer configured to:
provide the first of the two updated variable node values to the memory and subsequently provide the second of the two updated variable node values to the memory, in a first condition; and provide the second of the two updated variable node values to the memory and subsequently provide the first of the two updated variable node values to the memory, in a second condition.

* * * * *